United States Patent [19]
Misic et al.

[11] Patent Number: 5,258,717
[45] Date of Patent: Nov. 2, 1993

[54] GEOMETRICALLY ISOLATED MULTIPLE PORT VOLUME MRI RECEIVING COIL COMPRISING MULTIPLE QUADRATURE COILS

[75] Inventors: George J. Misic, Novelty, Ohio; Eric D. Reid, Turtle Creek, Pa.

[73] Assignee: Medrad, Inc., Pittsburgh, Pa.

[21] Appl. No.: 743,489

[22] Filed: Aug. 9, 1991

[51] Int. Cl.⁵ .......................................... G01R 33/20
[52] U.S. Cl. .................................................... 324/318
[58] Field of Search ............... 324/300, 307, 309, 318, 324/322; 128/653.5

[56] References Cited

U.S. PATENT DOCUMENTS

| | | | |
|---|---|---|---|
| 4,411,270 | 10/1983 | Damadian | 128/653 |
| 4,467,282 | 8/1984 | Siebold | 324/309 |
| 4,707,664 | 11/1987 | Fehn | 324/322 |
| 4,793,356 | 12/1988 | Misic et al. | 128/653 |
| 4,799,016 | 1/1989 | Rezvani | 324/318 |
| 4,923,459 | 5/1990 | Nambu | 606/130 |

OTHER PUBLICATIONS

"The NMR Phased Array", Magnetic Resonance in Medicine, P. B. Roemer, et al., vol. 16, (1990), pp. 192-225.

*Primary Examiner*—Michael J. Tokar
*Attorney, Agent, or Firm*—Keck, Mahin & Cate

[57] ABSTRACT

A magnetic resonance imaging receiving coil having an improved signal-to-noise ratio comprising two or more separate quadrature volume coils, each intercepting the two quadrature components of the magnetic resonance signal within its own sensitive volume, and the two or more quadrature coils being magnetically isolated from each other by overlap geometry along the axis normal to the plane of the magnetic resonance rotating field. The coils are connected to independent image processing channels of a data acquisition system, the outputs of the processing channels being combined to form an overall image.

16 Claims, 3 Drawing Sheets

GEOMETRICALLY ISOLATED MULTIPLE PORT VOLUME MRI RECEIVING COIL COMPRISING MULTIPLE QUADRATURE COILS

BACKGROUND OF THE INVENTION

The present invention relates to magnetic resonance imaging (MRI) systems, and more particularly, to a receiving coil having geometrically isolated multiple quadrature coils.

Receiving coils are used in magnetic resonance imaging systems to intercept the radio frequency magnetic field generated by a human subject or object in the presence of a main magnetic field. The radio frequency signals are in the form of a circularly polarized or rotating magnetic field, having an axis of rotation aligned with the main magnetic field.

Chronologically, the receiving coil first took the form of a volume coil which is designed to enclose a volume for receiving a body part, such as a leg, arm or head. See, for example, U.S. Pat. Nos. 4,411,270 to Damadian and 4,923,459 to Nambu. The surface receiving coil was then developed which is designed to be placed adjacent the region of interest. For a surface receiving coil, see, for example, U.S. Pat. No. 4,793,356 to Misic et al.

Advances in the field have resulted in modifications to volume and surface receiving coils to improve their signal-to-noise ratio. This was achieved by modifying the coils to pick up perpendicular components of the radio frequency magnetic resonance field. These coils are known as quadrature coils, which coils have a significant signal-to-noise ratio improvement over their non-quadrature counterparts. See, for example, U.S. Pat. Nos. 4,467,282 to Siebold and 4,707,664 to Fehn.

SUMMARY OF THE INVENTION

It is a primary object of the present invention to still further improve the signal-to-noise ratio of a magnetic resonance imaging receiving coil system.

The present invention is directed to a quadrature receiving coil used with a data acquisition system having multiple image processing channels to process a plurality of MRI signals and combine such processed signals to produce an image. The receiving coil comprises multiple quadrature coils, the coils intercepting both quadrature components of magnetic resonance signals in a spatially dependent manner. Each quadrature coil, which is a coil system in and of itself, provides coverage of a portion of a total target sensitive volume along an axis parallel to the main magnetic field. Consequently, each coil system has a sensitive volume smaller than that which would otherwise be necessary, so that each coil system can provide an improved signal-to-noise ratio from the region within its sensitive volume. Each of two leads which connects to each coil system is connected to a distinct processing channel of the data acquisition system. Using known techniques for combining the outputs of each processing channel, a final dataset from the entire target sensitive volume having a total signal-to-noise ratio greater than that with one large single coil system, can be achieved.

In the preferred embodiment, the receiving coil comprises first and second birdcage coils disposed on a tubular drum support member, about a common axis which is parallel to the axis of the main magnetic field. The first birdcage coil has a slightly larger diameter than the second coil so that it may overlap the second coil. The overlap region serves to magnetically isolate (zero mutual inductance) the coils from each other by causing the net shared flux between the two coils to be zero. Each coil is a quadrature coil, and in this regard, electrical feed connections are made to each coil at a 90 degree angle relative to the common axis of the coils, but the first and second coils may be rotated relative to one another without disturbing the signal-to-noise ratio or the electrical isolation of the overall system. The electrical feed connections to each coil connect to separate ports of a data acquisition system and are amplified and digitized separately in independent processing channels. The independent digitized image signals are combined according to an algorithm, known in the art, to produce an image with an improved signal-to-noise ratio.

The receiving coil system of the preferred embodiment is designed to image many anatomical regions of the body or other region such as the knee, leg, arm or head.

The above and other objects and advantages will become more readily apparent when reference is made to the following description taken in conjunction with the accompanying drawings.

DETAILED DESCRIPTION OF THE DRAWINGS

Figure 1:
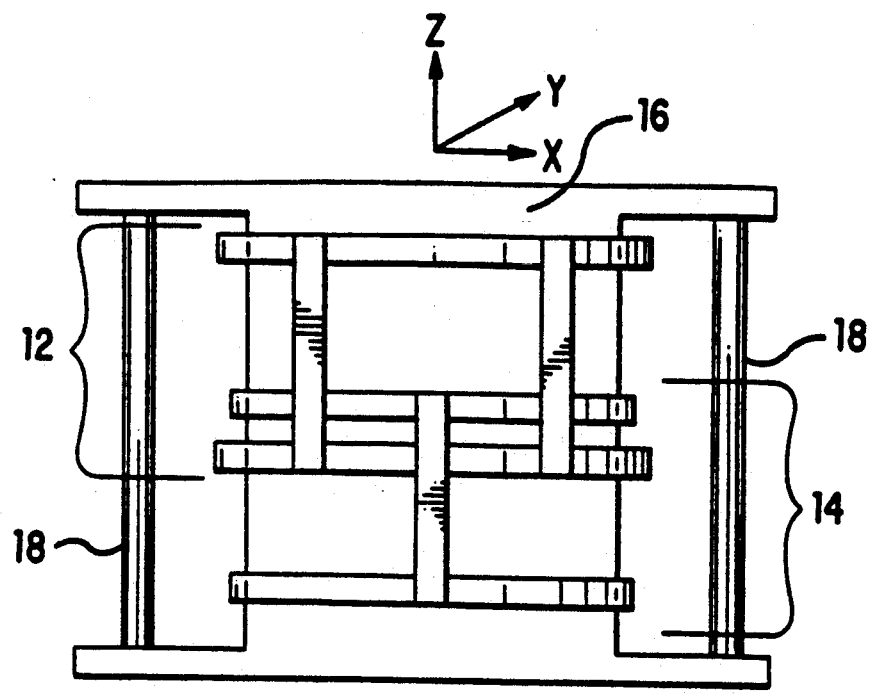
FIG. 1 is a side view of the multiple quadrature coil system receiving coil in accordance with the present invention.
Figure 2:
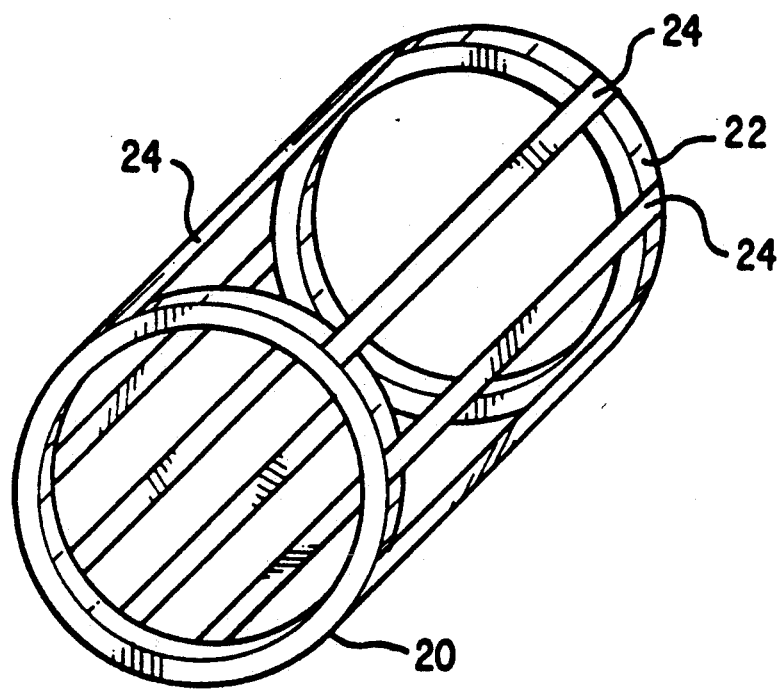
FIG. 2 is a perspective view of a single quadrature birdcage coil forming part of the receiving coil shown in FIG. 1.

Referring first to FIGS. 1 and 2, the coil of the preferred embodiment is shown generally at lo. The coil 10 is a volume coil designed for a variety of anatomical regions of the body or other regions, such as the knee, leg, arm or head. The coil 10 comprises two separate quadrature volume coils 12 and 14 disposed around a hollow cylindrical drum 16. Support rods 18 may be provided which extend the length of the drum 16 to stabilize the drum.

The coils 12 and 14 are "birdcage" coils which are well known in the art and as shown in FIG. 2, comprise circular conductive loops 20 and 22 connected to each other by conductive connection members 24. There may be as many as eight connection members 24 joining the circular conductive loops 20 and 22. Each coil can be viewed as a separate quadrature coil system.

Magnetic interaction between the coils 12 and 14 is eliminated by positioning the coils about the drum support member 16 so as to have radial symmetry about the axis parallel to the main magnetic field, which is the Z-axis shown in FIG. 1. Moreover, coil 12 is slightly larger in diameter than coil 14 so that coil 12 may overlap coil 14. The overlap is adjusted so that the net flux from one coil, as seen as the vector sum of the flux from the overlap region, exactly cancels the flux from the return through the balance of the coil. This causes the net shared flux, and thus a net mutual inductance of zero between the adjacent coil systems. The coils maintain their isolation irrespective of the relative rotational position about their common axis.

The coils 12 and 14 have symmetry about two planes parallel to the Z-axis, which planes are at right angles to each other. In addition, the two coils are arranged so that the net rotating magnetic vector of each coil is in the X-Y plane, but spatially displaced from each other along the Z-axis. In this regard, each coil system intercepts the quadrature components of the magnetic resonance signal within its own sensitive volume.

Figure 3:
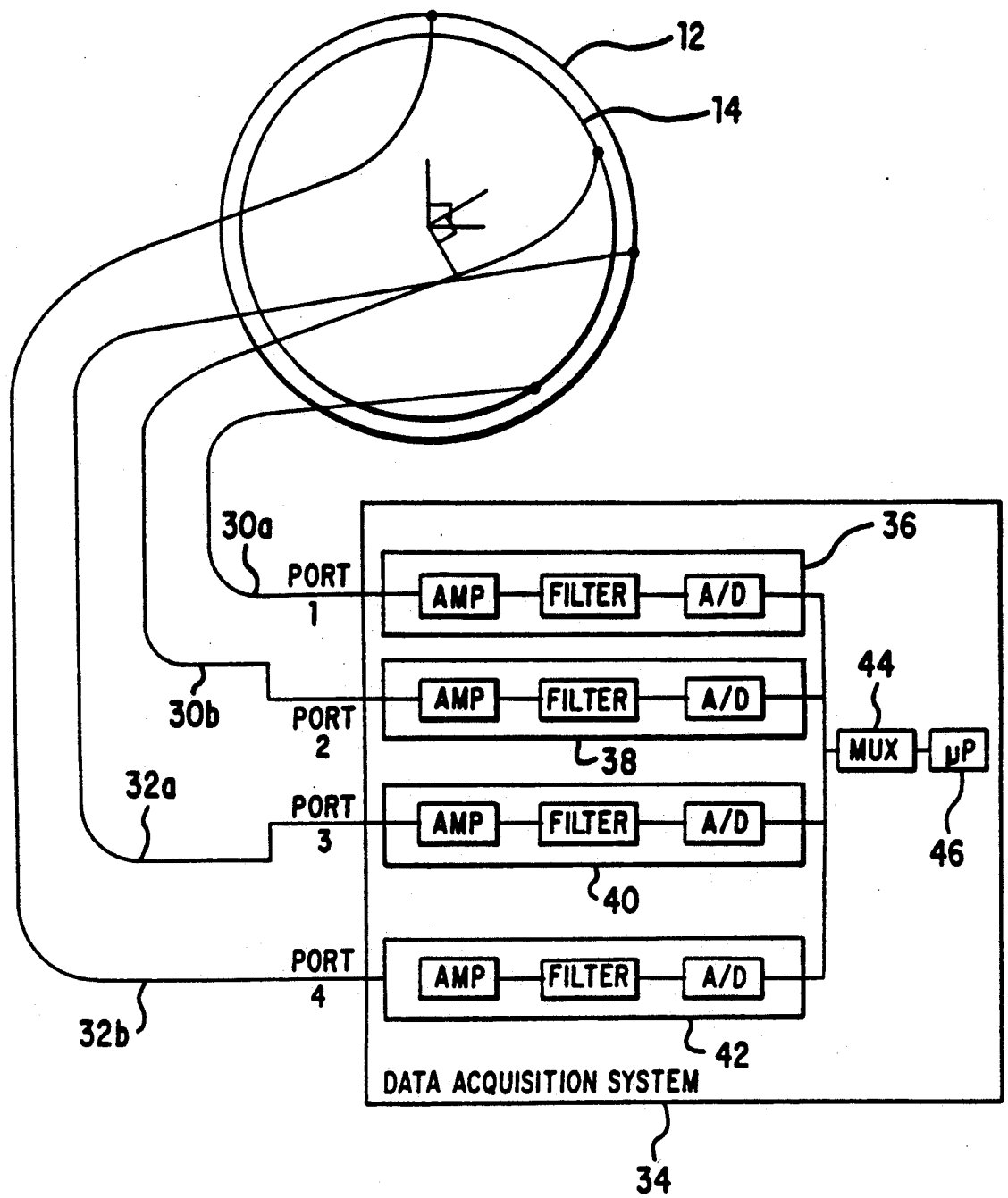
FIG. 3 is a schematic diagram illustrating the electrical connections to the coil systems of the receiving coil shown in FIG. 1.

FIG. 3 illustrates the manner in which electrical feed connections are made to the coils 12 and 14. Each lead of the coils is connected to a respective port of a known data acquisition system 34, by a pair of coaxial electrical leads. The data acquisition system 34 is described in an article by Roemer et al., entitled "The NMR Phased Array", *Magnetic Resonance in Medicine*, Vol. 16 (1990), pp. 192-225. This system comprises multiple processing channels 36-42 each of which includes an amplifier, filter, and A/D converter, to process each of the image signals picked up by the leads 30a, 30b, 32a and 32b. The output of each of the channels is multiplexed by the multiplexer 44 and combined according to a weighting algorithm by the computer/microprocessor 46. The algorithm is designed to select the outputs of the processing channels and combine them so as to produce a best overall image signal (i.e., maximum signal-to-noise ratio, etc).

The coaxial leads 30a and 30b connect to the coil 12 at points which are at 90 degrees relative to each other and connect, respectively, to ports 1 and 2 of the data acquisition system 36. Likewise, coaxial leads 32a and 32b connect to coil 14 at points which are at 90 degrees relative to each other and connect, respectively, to ports 3 and 4 of the data acquisition system 36. Each coaxial lead comprises a center conductor and a shield, as is well known in the art. An electrical network (not shown) is interconnected between the coaxial lead and the coil to appropriately connect the cable to the coil. Such a network is well known in the art. Furthermore, the coils 12 and 14 may be rotated relative to one another without destroying the signal-to-noise improvements achieved in accordance with the present invention.

Figure 4:
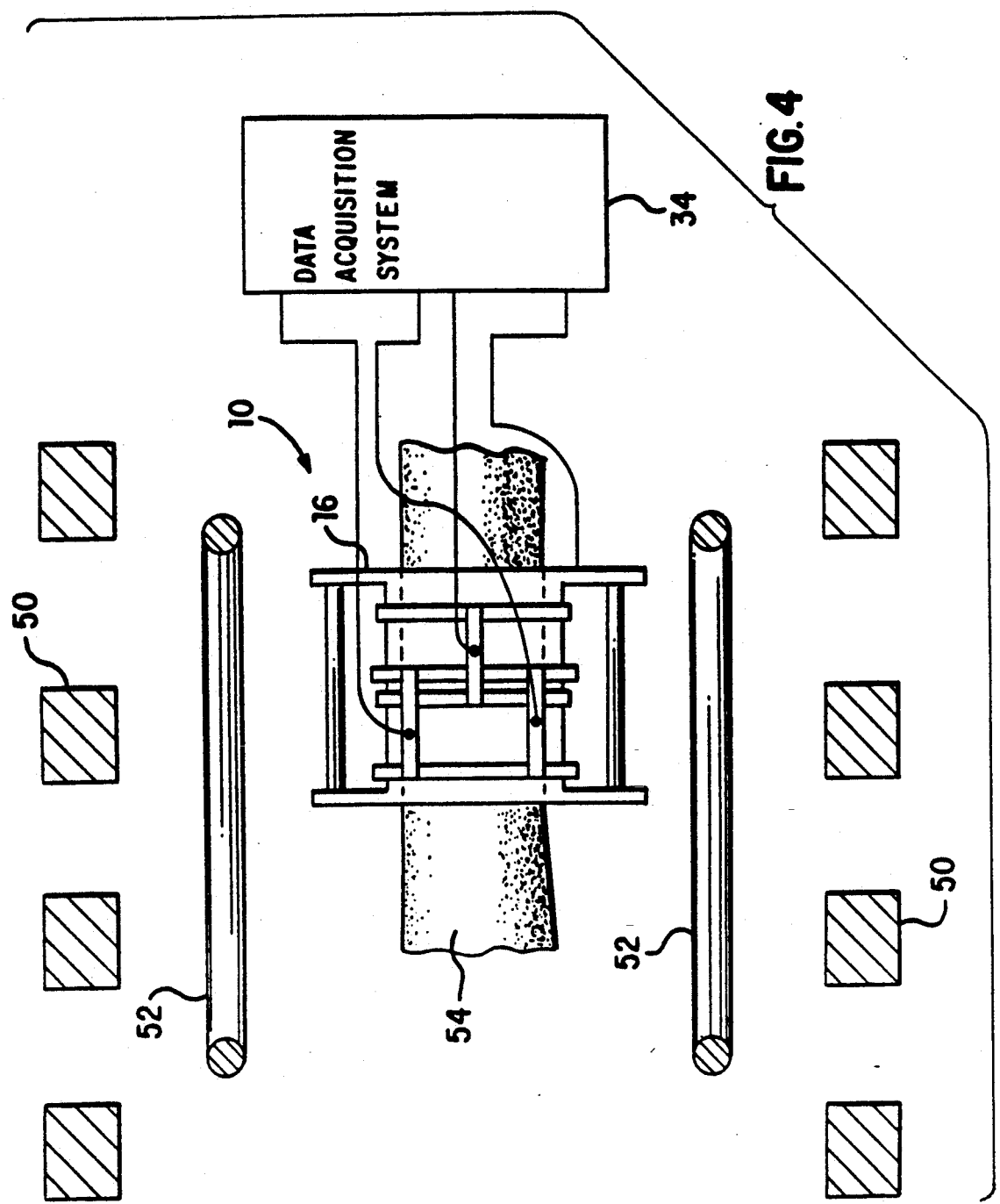
FIG. 4 is a block diagram illustrating the receiving coil of the present invention as part of a magnetic resonance imaging system.

FIG. 4 illustrates a particular use of the coil 10 as part of an MRI system. As is well known in the art, an MRI system includes a main magnetic field generator 50, a radio frequency (RF) excitation generator 52, as well as a receiving probe placed adjacent the region of interest. The coil 10 is designed to receive a limb, head, knee, or other part of the body inside the hollow opening of the drum 16. This is represented in the Figure as reference numeral 54. The coil 10 is appropriately connected to the data acquisition system 34 (as shown in FIG. 3) to permit analysis of the magnetic resonance signals emitted from the body part 54 and picked up by the coil 10.

The present invention is an improvement over prior art receiving coils when multiple means for processing image signals are available. The sensitive volume of the coil system is expanded, allowing for the interception of both quadrature components of MRI signals in a spatially dependent manner, with each coil system providing coverage of a portion of the desired sensitive volume along the axis parallel to the main magnetic field. Consequently, each coil system has a sensitive volume smaller than that which would otherwise be necessary; each such coil system can provide improved signal-to-noise ratio from the region within its sensitive volume. Using procedures well known in the art to acquire the MRI data, a final set of data from the entire target sensitive volume can be generated having an improved total signal-to-noise ratio. Specifically, whereas a typical single quadrature coil system gives $\sqrt{2}$ signal-to-noise ratio advantage over a linear coil system, two quadrature coil systems yield $\sqrt{2}$ gain over the single quadrature coil system.

It is to be understood that the present invention is not limited to two coil systems. Rather, the present invention may be embodied as an N-quadrature coil system, where N is an integer, and where N processing means are available for each coil system, the data processed by each of the processing means for the associated coil, being combined to produce a best desired image.

The above description is intended by way of example only and is not intended to limit the present invention in any way, except as set forth in the following claims.

We claim:

1. A magnetic resonance imaging receiving coil comprising:

a plurality of quadrature volume coils having a common axis of symmetry parallel to an axis of a main magnetic field generated for magnetic resonance imaging, adjacent quadrature volume coils adjusted to have an overlap region such that the vector sum of the flux in the overlap region from one of said adjacent quadrature volume coils cancels the flux from the return through the balance of said one of said adjacent quadrature volume coils, so as to magnetically isolate adjacent quadrature volume coils from each other, the totality of said quadrature volume coils enclosing a target sensitive volume; and means for electrically connecting each of said quadrature volume coils to a separate image processing means, which separate image processing means are independent of each other.

2. The magnetic resonance imaging receiving coil of claim 1, wherein each of said volume coils comprises first and second conductive loops spaced from one another about the common axis and a plurality of conductive connecting members connecting said conductive loops and being parallel to the common axis.

3. A magnetic resonance imaging receiving coil comprising:

a plurality of quadrature volume coils;

support means for mounting said plurality of quadrature volume coils so that said volume coils have a common axis of symmetry parallel to an axis of a main magnetic field generated for magnetic resonance imaging, adjacent quadrature volume coils adjusted to have an overlap region such that the vector sum of the flux in the overlap region from one of said adjacent quadrature volume coils cancels the flux from the return through the balance of said one of said adjacent quadrature volume coils, so as to magnetically isolate adjacent quadrature volume coils from each other, the totality of said quadrature volume coils enclosing a target sensitive volume; and means for electrically connecting each of said quadrature volume coils to a separate image processing means, which separate image processing means are independent of each other.

4. The magnetic resonance imaging receiving coil of claim 3, wherein each of said volume coils comprises first and second conductive loops spaced from one another about the common axis and a plurality of conductive connecting members connecting said conductive loops and being parallel to the common axis.

5. A magnetic resonance imaging receiving coil comprising:
   a first quadrature volume coil;
   a second quadrature volume coil;
   support means for mounting said plurality of quadrature volume coils so that said first and second volume coils have a common axis of symmetry parallel to an axis of a main magnetic field generated for magnetic resonance imaging, adjacent quadrature volume coils adjusted to have an overlap region such that the vector sum of the flux in the overlap region from one of said adjacent quadrature volume coils cancels the flux from the return through the balance of said one of said adjacent quadrature volume coils, so as to magnetically isolate adjacent quadrature volume coils from each other, the totality of said quadrature volume coils enclosing a target sensitive volume; and
   means for electrically connecting said first and second quadrature volume coils to a separate image processing means, which separate image processing means are independent of each other.

6. The magnetic resonance imaging receiving coil of claim 5, wherein said first and second quadrature coils are rotatable relative to one another on said support member about the axis of said main magnetic field.

7. The magnetic resonance imaging receiving coil of claim 5, wherein each of said volume coils comprises first and second conductive loops spaced from one another about the common axis and a plurality of conductive connecting members connecting said conductive loops and being parallel to the common axis.

8. A magnetic resonance imaging system comprising:
   means for generating a main magnetic field;
   means for generating a radio frequency excitation field;
   a magnetic resonance imaging receiving coil comprising;
      a plurality of quadrature volume coils having a common axis of symmetry parallel to an axis of a main magnetic field generated for magnetic resonance imaging, adjacent quadrature volume coils adjusted to have an overlap region such that the net flux in the overlap region from one of said adjacent quadrature volume coils, cancels the flux from the return through the balance of said one of said adjacent quadrature volume coils, so as to magnetically isolate adjacent quadrature volume coils from each other, the totality of said quadrature volume coils enclosing a target sensitive volume;
      a plurality of independent image processing means; and
      means for electrically connecting each of said quadrature volume coils to a unique one of said image processing means.

9. The magnetic resonance imaging system of claim 8, wherein each of said plurality of volume coils comprises first and second conductive loops spaced from one another about the common axis and a plurality of conductive connecting members connecting said conductive loops and being parallel to the common axis.

10. The magnetic resonance imaging system of claim 8, wherein said means for electrically connecting comprises first and second leads for each quadrature volume coil, said first and second leads being connected to each coil so as to pick up quadrature components of magnetic resonance signals, and each of said first and second leads connecting to distinct image processing means.

11. A magnetic resonance imaging receiving coil comprising:
   a plurality of quadrature coils, adjacent quadrature volume coils adjusted to have an overlap region such that the net flux in the overlap region from one of said adjacent quadrature volume coils cancels the flux from the return through the balance of said one of said adjacent quadrature volume coils, so as to magnetically isolate adjacent quadrature volume coils from each other; and
   means for electrically connecting each of said quadrature coils to a separate image processing means, which separate image processing means are independent of each other.

12. A magnetic resonance imaging receiving coil for use with a data acquisition system having a plurality of independent image processing channels, and means for combining the output of said image processing channels to produce an image, the coil comprising:
   a plurality of quadrature volume coils having a common axis of symmetry parallel to an axis of a main magnetic field generated for magnetic resonance imaging, adjacent quadrature volume coils adjusted to have an overlap region such that the net flux in the overlap region from one of said adjacent quadrature volume coils cancels the flux from the return through the balance of said one of said adjacent quadrature volume coils, so as to magnetically isolate adjacent quadrature volume coils from each other, the totality of said quadrature volume coils enclosing a target sensitive volume; and
   means for electrically connecting each of said quadrature volume coils to a unique one of said independent image processing channels.

13. The magnetic resonance imaging receiving coil of claim 12, wherein each of said volume coils comprises first and second conductive loops spaced from one another about the common axis and a plurality of conductive connecting members connecting said conductive loops and being parallel to the common axis.

14. The magnetic resonance imaging system of claim 12, wherein said means for electrically connecting comprises first and second leads for each quadrature volume coil, said first and second leads being connected to each coil so as to pick up quadrature components of magnetic resonance signals, and each of said first and second leads connecting to distinct image processing channels.

15. In a magnetic resonance imaging system including means for generating a main magnetic field; means for generating a radio frequency excitation field; a data acquisition system including a plurality of independent image processing channels and means to combine outputs of said image processing channels to produce an image, the improvement comprising:
   a magnetic resonance imaging receiving coil comprising a plurality of quadrature volume coils having a common axis of symmetry parallel to an axis of a main magnetic field generating for magnetic resonance imaging, adjacent quadrature volume coils adjusted to have an overlap region such that the net flux in the overlap region form one of said adjacent quadrature volume coils cancels the flux from the return through the balance of said one of said adjacent quadrature volume coils, so as to magnetically isolate quadrature volume coils from each other, the totality of said coils enclosing a target sensitive volume; and means for electrically connecting each of said volume coils to a unique one of said independent image processing channels.

16. The improvement of claim 15, wherein said means for electrically connecting comprises first and second leads for each quadrature volume coil, said first and second leads being connected to each coil so as to pick up quadrature components of magnetic resonance signals, and each of said first and second leads connecting to distinct image processing channels.

* * * * *